United States Patent
Wang et al.

(10) Patent No.: US 9,082,935 B2
(45) Date of Patent: Jul. 14, 2015

(54) LIGHT-EMITTING ELEMENT AND THE LIGHT-EMITTING ARRAY HAVING THE SAME

(71) Applicant: Epistar corporation, Hsinchu (TW)

(72) Inventors: Jhih-Sian Wang, Hsinchu (TW); Yao-Ru Chang, Hsinchu (TW); Yiwen Huang, Hsinchu (TW); Guo-Chin Liu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 214 days.

(21) Appl. No.: 13/668,716

(22) Filed: Nov. 5, 2012

(65) Prior Publication Data
US 2014/0124798 A1      May 8, 2014

(51) Int. Cl.
H01L 33/00 (2010.01)
H01L 33/38 (2010.01)
H01L 27/15 (2006.01)
H01L 33/22 (2010.01)
H01L 33/32 (2010.01)
H01L 33/40 (2010.01)

(52) U.S. Cl.
CPC .............. *H01L 33/38* (2013.01); *H01L 33/405* (2013.01); *H01L 27/156* (2013.01); *H01L 33/22* (2013.01); *H01L 33/32* (2013.01); *H01L 33/40* (2013.01)

(58) Field of Classification Search
CPC ......... H01L 33/08; H01L 33/20; H01L 33/46; H01L 33/60; H01L 33/382; H01L 33/405; H01L 51/5212
See application file for complete search history.

(56) References Cited

U.S. PATENT DOCUMENTS

| 5,917,202 A | 6/1999 | Haitz et al. | |
|---|---|---|---|
| 7,811,838 B2 | 10/2010 | Hon | |
| 2008/0157109 A1* | 7/2008 | Hon | 257/98 |
| 2008/0296595 A1* | 12/2008 | Chu | 257/96 |
| 2011/0089444 A1* | 4/2011 | Yao et al. | 257/93 |
| 2012/0080697 A1* | 4/2012 | Chen et al. | 257/91 |

* cited by examiner

*Primary Examiner* — Whitney T Moore
*Assistant Examiner* — Joseph Galvin, III
(74) *Attorney, Agent, or Firm* — Bacon & Thomas, PLLC

(57) ABSTRACT

A light-emitting element includes: a light-emitting structure; a plurality of first contact portions separately on the light-emitting structure; and a plurality of reflective portions disposed separately among the plurality of first contact portions.

18 Claims, 6 Drawing Sheets

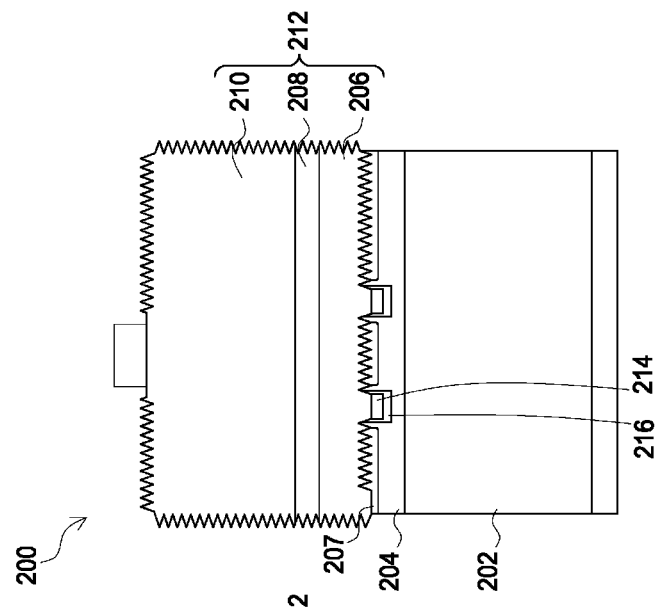
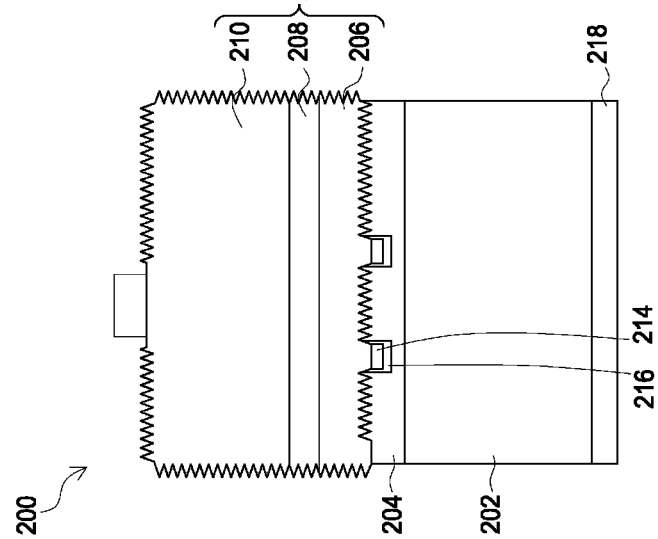

LIGHT-EMITTING ELEMENT AND THE LIGHT-EMITTING ARRAY HAVING THE SAME

TECHNICAL FIELD

The application relates to a light emitting element and the light-emitting array having the same, and more particularly to a light emitting element including contact portions on the bottom of the light-emitting structure, and the light-emitting array having the same.

DESCRIPTION OF BACKGROUND ART

The current-spreading effect of an LED element regards the brightness thereof. Conventionally, an electrode pad can be formed on the top semiconductor layer to input current to an LED element, and one or more than one extension electrodes extended from the electrode pad can be also formed on the top semiconductor layer to improve current-spreading.

Nevertheless, the disposition of the extension electrodes causes adverse influence on light-extraction of the LED element because the extension electrodes are metal so as to absorb or block the light of the LED element. Furthermore, if the contact area between the extension electrode and the top semiconductor layer is insufficient, the forward voltage of the LED element may be raised so the electrical efficiency is lowered accordingly.

In addition, the LED element can be further connected to other components in order to form a light emitting apparatus. The LED element may be mounted onto a submount with the side of the substrate of the LED element, or a solder bump or a glue material may be formed between the submount and the light-emitting element, therefore a light-emitting apparatus is formed. Besides, the submount further comprises the circuit layout electrically connected to the electrode of the light-emitting element via an electrical conductive structure such as a metal wire.

SUMMARY OF THE DISCLOSURE

A light-emitting element includes: a light-emitting structure; a plurality of first contact portions separately on the light-emitting structure; and a plurality of reflective portions disposed separately among the plurality of first contact portions.

BRIEF DESCRIPTION OF THE DRAWINGS

FIGS. 2A and 2B show a light-emitting element in accordance with a second embodiment of the present application.

DETAILED DESCRIPTION OF PREFERRED EMBODIMENTS

Figure 1A:
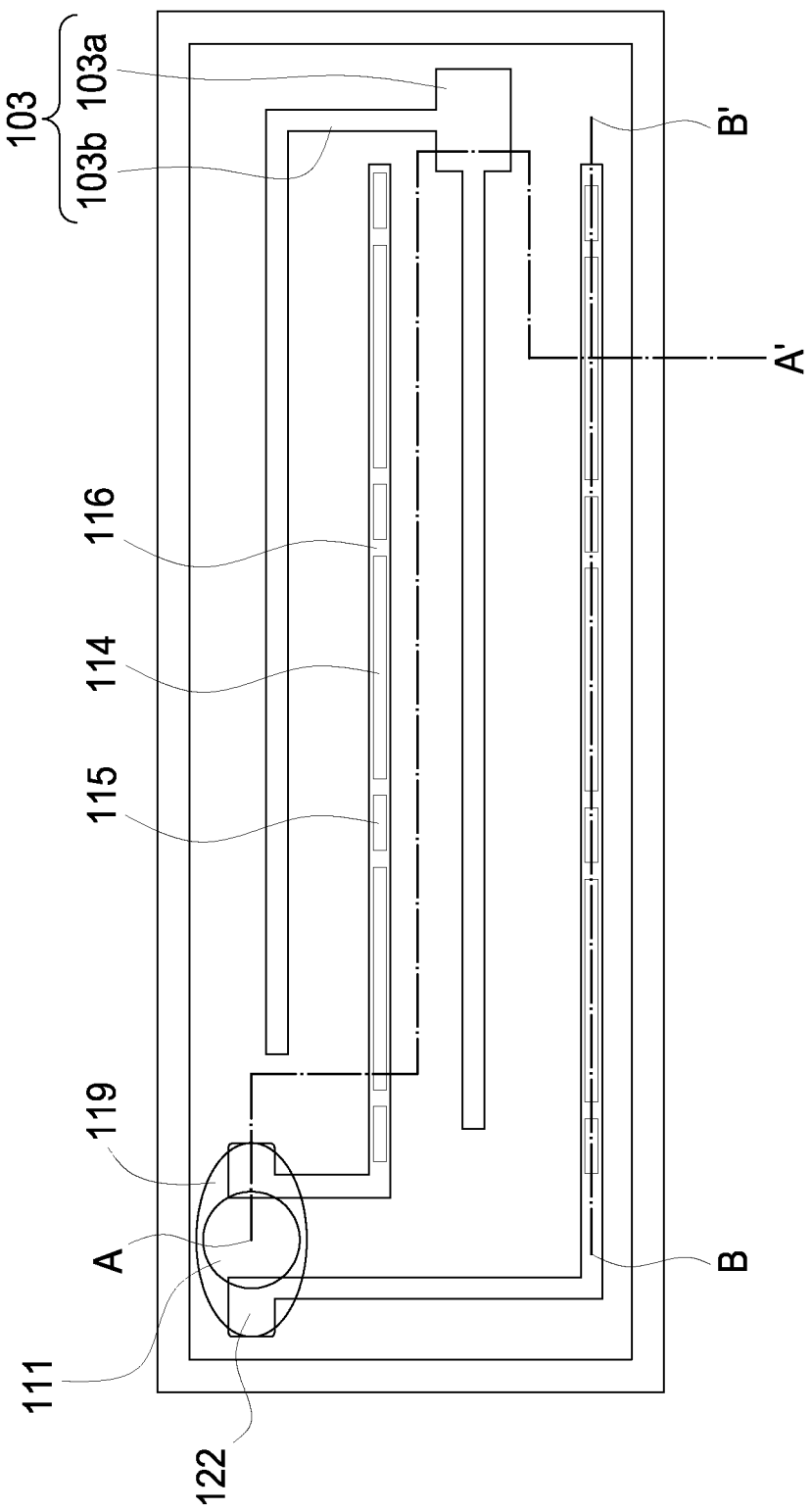
FIG. 1A shows a top view of a light-emitting element in accordance with a first embodiment of the present application.
Figure 1C:
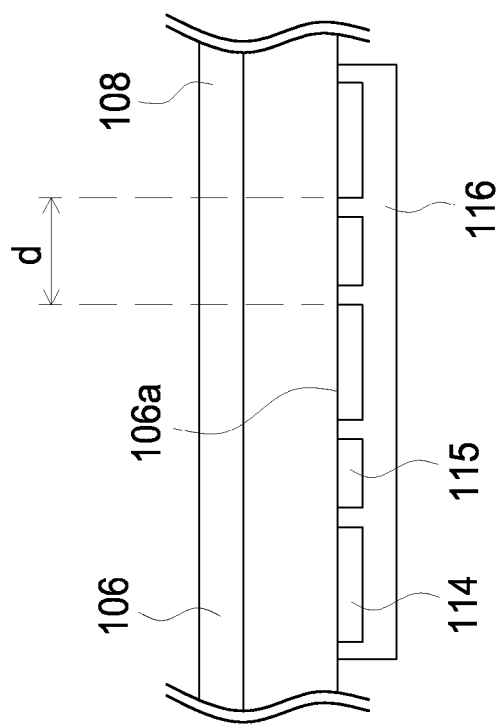
FIGS. 1B and 1C show two different cross-sectional views of the FIG. 1A.
Figure 1B:
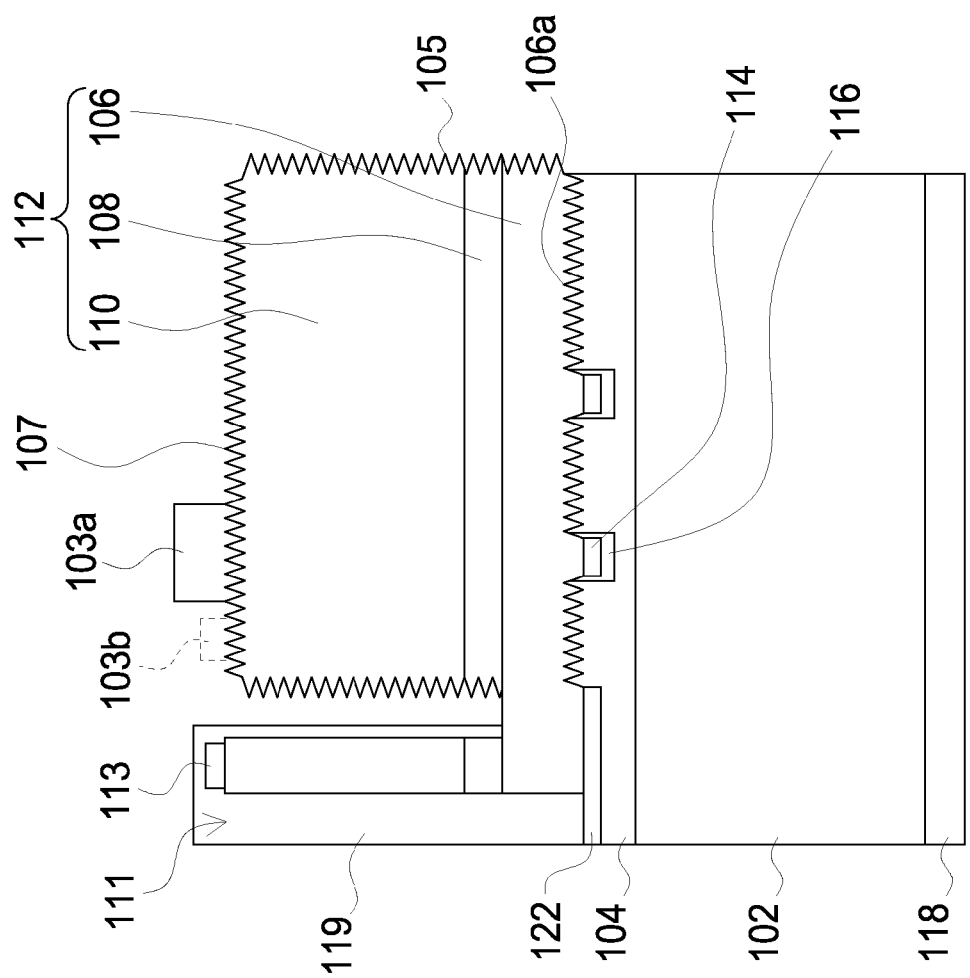

Referring to FIGS. 1A to 1C. FIG. 1A shows a top view of a light-emitting element in accordance with a first embodiment of the present application, and FIGS. 1B and 1C shows two different cross-sectional views of FIG. 1A in accordance with lines AA' and BB' respectively. A light-emitting element 100 includes: a substrate 102; a light-emitting structure 112 formed above the substrate 102; and an insulating bonding layer 104 attaching the light-emitting structure 112 to the substrate 102. A plurality of semiconductor contact portions 114 is in ohmic contact with the bottom of the light-emitting structure 112, and a plurality of reflective portions 115 is formed between the plurality of semiconductor contact portions 114 and in contact with the bottom of the light-emitting structure 112. In other words, the reflective portions 115 are disposed separately among the semiconductor contact portions 114, and the arrangement includes alternate semiconductor contact portion 114 and reflective portion 115. The reflectivity of the reflective portions 115 is larger than that of the semiconductor contact portions 114, and the semiconductor contact portions 114 can have better ohmic contact to the light-emitting structure 112 than the reflective portions 115 do. The shape of the reflective portions 115 can be rectangle. The semiconductor contact portions 114 and the reflection portions 115 can be arranged as multiple groups, and each group includes N semiconductor contact portions 114 and N−1 reflection portions 115. Each group can also be covered by a metal contact portion 116. In the embodiment, the light-emitting element 100 has two metal contact portions 116 on the bottom of the light-emitting structure 112, and each metal contact portion 116 has three semiconductor contact portions 114 and two reflection portions 115 embedded therein. The semiconductor contact potions 114 embedded in the metal contact portions 116 are arranged as a stripe, and a distance d between two adjacent semiconductor contact portions 114 along the stripe can be within a range of 10~50 μm to accommodate the reflective portion 115. To be more specific, each distance d can be about 30 μm. The metal contact portion 116 has a width $w_1$ wider than a width $w_2$ of the semiconductor contact portion 114, and the ratio of $w_1$ to $w_2$ can be from 1.2 to 1.8. In the embodiment, the width $w_1$ of the metal contact portion 116 can be about 6 μm, and the width $w_2$ of individual semiconductor contact portion 114 can be about 4 μm. The light-emitting structure 112 includes a lower semiconductor layer 106, an active layer 108 and an upper semiconductor layer 110. The lower semiconductor layer 106 has a bottom surface 106a being the bottom of the light-emitting structure 112 as well, and the semiconductor contact portions 114, the reflection portions 115, and the metal contact portions 116 contact the bottom surface 106a directly. As shown in FIG. 1C, the semiconductor contact portions 114, the reflective portions 115 and the metal contact portions 116 are coplanar on the bottom surface 106a. A trench 111 can be formed to expose a part of the lower semiconductor layer 106, and the metal contact portion 116 can have a contact end 122 exposed by the trench 111, and a conductive channel 119 can be installed to the trench 111 to electrically connect the lower semiconductor layer 106 to the upper surface 107 of the light-emitting structure 112, and an electrode 113 can be disposed on the upper surface 107 of the light-emitting structure 112 to electrically connect to the conductive channel 119. Besides, the substrate 102 can be transparent, and a reflective layer 118 can be formed on bottom of the substrate 102 to enhance the light extraction. The material of the substrate 102 can be insulating material such as Sapphire, or conductive material such as SiC. The light-emitting structure 112 can further include roughened areas on the top surface 107, a bottom surface 106a and side wall 105 thereof. Referring to FIG. 1A, a top contact portion 103, including metal, and having a pad 103a and an extension part 103b extended from the pad 103a can be formed on one side of the light-emitting structure 112, and the side disposing the top contact portion 103 is opposite to that disposing the first contact portion 114, as shown in FIG. 1B, the pad 103a and the extension part 103b are on the upper surface 107. The extension part 103b of the top contact portion 103 can be arranged as a stripe.

The light-emitting structure 112 can be formed in an MOCVD chamber and composed of materials such as the series of aluminum gallium indium phosphide (AlGaInP), the series of aluminum gallium indium nitride (AlGaInN), and/or the series of zinc oxide (ZnO). The active layer can be configured to be a single heterostructure (SH), a double heterostructure (DH), a double-side double heterostructure (DDH), or a multi-quantum well (MQW) structure. The semiconductor contact portions 114 can be GaAs, AlGaAs, AlGaInP, GaN, InGaN and AlN, and the metal contact portions 116 can be Ge, Au, Ag, Pt, Cu, Al, Cr and the alloy thereof. To be more specific, the light-emitting structure 112 can be AlGaInP, and the semiconductor contact portions 114 can be GaAs, and the metal contact portions 116 can be GeAu. The material of the reflective portion 115 can be Ag, Pt, Al, Pb, Sn, Cu or the metal alloy thereof.

The discontinuous semiconductor contact portions 114 absorb less light from the active layer 108 comparing to a continuous one, and the reflective portions 115 formed among the semiconductor contact portions 114 can enhance light extraction by reflecting light. The arrangement of the semiconductor contact portions 114, the reflective portions 115 embedded in a metal contact portion 116, and the ratio of the width of the metal contact portion 116 to that of the semiconductor portion 114 can raise lumen per watt of the light-emitting element 100.

Referring to FIGS. 2A and 2B, a light-emitting element in accordance with a second embodiment of the present application is disclosed. A light-emitting element 200 includes: a conductive substrate 202; a light-emitting structure 212 formed above the conductive substrate 202 and including a lower semiconductor layer 206, an active layer 208, and an upper semiconductor layer 210; and a transparent conductive bonding layer 204 attaching the light-emitting structure 212 to the conductive substrate 202. Similar to the first embodiment, the semiconductor contact portions 214 and the reflective portions (not shown) are embedded in the metal contact portion 216. One difference between two embodiments is that the light-emitting element 200 is vertical-type by including the conductive bonding layer 204 and the conductive substrate 202. The conductive bonding layer 204 can be metal oxide including material such as ITO, AZO, IZO, YZO or ZnO. The conductive substrate 202 can be transparent and has a reflective layer 218 on the bottom thereof to enhance light-extraction of the light-emitting element 200 as shown in FIG. 2A, or a reflective layer 207 can be formed on partial regions of the bottom of the light-emitting structure 212 as shown in FIG. 2B, and the reflective layer 207 and the metal contact portions 216 locate on different regions of the bottom of the light-emitting structure 212.

Figure 3A:
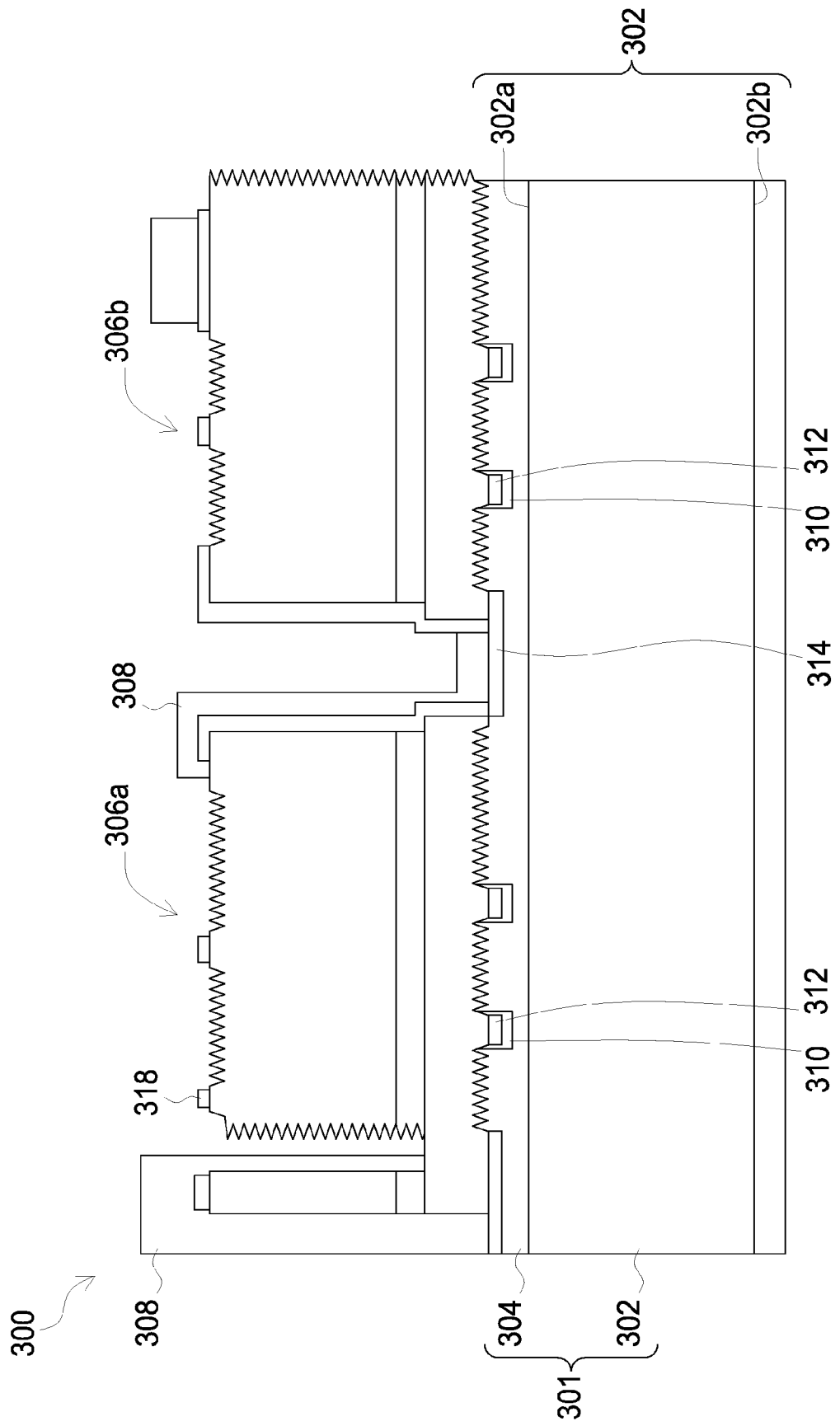
FIG. 3A and FIG. 3B show a light-emitting array in accordance with a third embodiment of the present application.
Figure 3B:
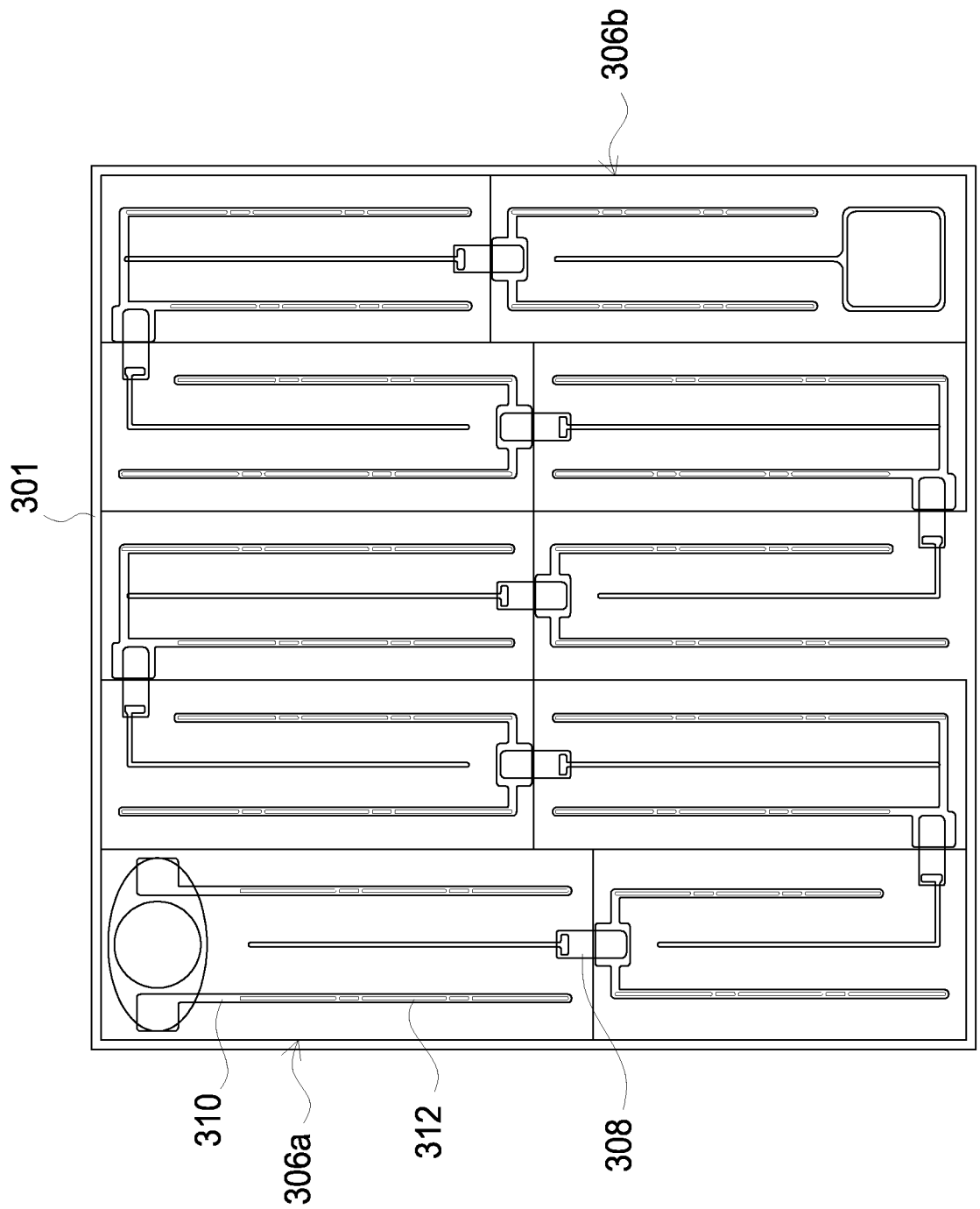

Referring to FIG. 3A, a light-emitting array in accordance with a third embodiment of the present application is disclosed. A light-emitting array 300 includes: an insulating carrier structure 301; and a plurality of light-emitting units 306a, 306b formed on the insulating carrier structure 301. The semiconductor layers of the light-emitting unit 306a or 306b can be similar to the light-emitting structure of the first embodiment. The disposition and arrangement of the first contact portions 312, reflection portions (not shown), metal contact portions 310 and a top contact portion 318 can be similar to that of the first embodiment. The insulating carrier structure 301 includes a substrate 302 having an upper surface 302a and a bottom surface 302b, and an insulating bonding layer 304 attaching the light-emitting units 306a, 306b to the upper surface 302a of the substrate 302. The material of the insulating bonding layer 304 can be polyimide, BCB, PFOB, epoxy, acrylic resin, COC, PMMA, PET, PC, polyetherimide, fluorocarbon polymer, silicone resin, glass, $Al_2O_3$, $SiO_2$, $TiO_2$, $SiN_x$, or SOG. A conductive line 308 can connect the light-emitting units 306a and 306b in series connection by connecting the upper semiconductor layer 310 of the light-emitting unit 306a to a metal contact 314 extended from the metal contact portion 310 of the light-emitting unit 306b to electrically connect to the lower semiconductor layer 206 of the light-emitting units 306b, and in FIG. 3B, the light-emitting array can be connected in series by including the light-emitting units 306a, the light-emitting unit 306b, and other light-emitting units connected between the light-emitting units 306a and the light-emitting unit 306b, nevertheless, the light-emitting units can be also connected in parallel or antiparallel.

Figure 4:
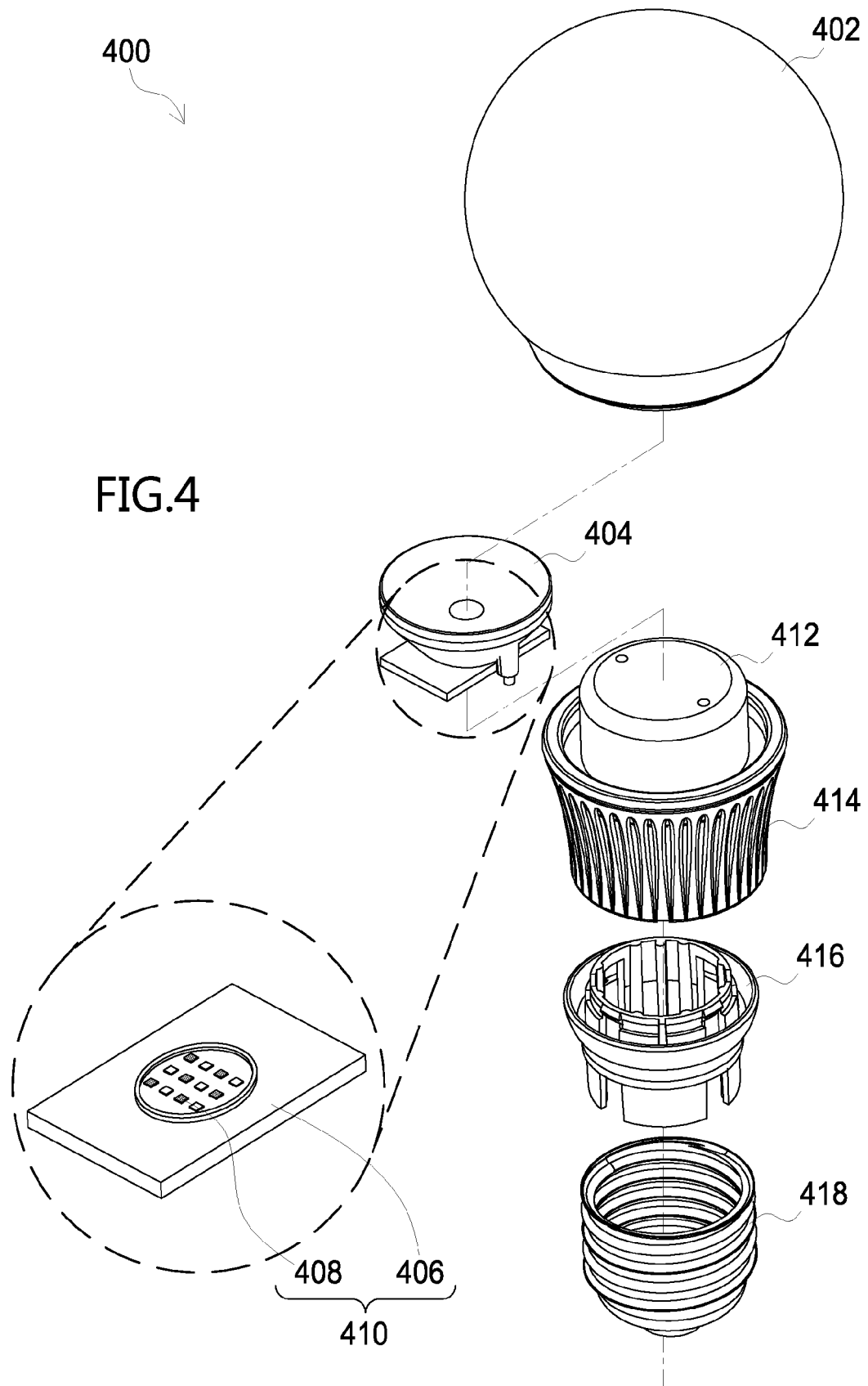
FIG. 4 shows a light bulb in accordance with a fourth embodiment of the present application.

Referring to FIG. 4, a light bulb in accordance with a fourth embodiment of the present application is disclosed. The bulb 400 includes a cover 402, a lens 404, a lighting module 410, a lamp holder 412, a heat sink 414, a connecting part 416, and an electrical connector 418. The lighting module 410 includes a carrier 406 and a plurality of light-emitting elements 408 of any one of the above mentioned embodiments on the carrier 406.

Although the present application has been explained above, it is not the limitation of the range, the sequence in practice, the material in practice, or the method in practice. Any modification or decoration for present application is not detached from the spirit and the range of such.

What is claimed is:

1. A light-emitting element, comprising:
   a light-emitting structure;
   a plurality of first contact portions disposed separately on the light-emitting structure;
   a plurality of reflective portions disposed separately among the first contact portions; and
   a second contact portion covering the first contact portions and the reflective portions, wherein there are N first contact portions and N−1 reflective portions embedded in a second contact portion.

2. The light-emitting element according to claim 1, wherein the first contact portions, the reflection portions are coplanar on the light-emitting structure.

3. The light-emitting element according to claim 1, wherein the first contact portion comprises semiconductor and the second contact portion comprises metal.

4. The light-emitting element according to claim 1, wherein the first contact portion comprises GaAs, AlGaAs, AlGaInP, GaN, InGaN, AlN, and the second contact portion comprises Ge, Au, Cu, Al, Ag, Cr, Pt and the alloy thereof.

5. The light-emitting element according to claim 1, wherein the ratio of the width of the second contact portion to that of the first contact portion is between 1.2~1.8.

6. The light-emitting element according to claim 1, wherein the second contact portion is arranged as a stripe.

7. The light-emitting element according to claim 6, wherein the distances between the adjacent first contact portions along the stripe are in a range of 10 μm to 50 μm.

8. The light-emitting element according to claim 1, further comprising a substrate; and an insulating bonding layer attaching the light-emitting structure to the substrate.

9. The light-emitting element according to claim 1, further comprising a conductive substrate; and a conductive bonding layer attaching the light-emitting structure to the conductive substrate.

10. The light-emitting element according to claim 9, further comprising a reflective layer formed between the light-emitting structure and the conductive bonding layer, wherein the reflective layer and the second contact portions locate on different regions of the light-emitting structure.

11. The light-emitting element according to claim 1, further comprising a top contact portion on a side of the light-emitting structure opposite to the first contact portion.

12. The light-emitting element according to claim 11, wherein the top contact portion comprises metal.

13. The light-emitting element according to claim 11, wherein the top contact portion is arranged as a stripe.

14. The light-emitting element according to claim 1, wherein the first contact portion is in ohmic contact with the light-emitting structure.

15. The light-emitting element according to claim 1, wherein the reflectivity of the reflective portions is greater than that of the first contact portions.

16. The light-emitting element according to claim 1, wherein the shape of the reflective portions comprises rectangle.

17. A light-emitting array comprising:
an insulating carrier structure carrying multiple light-emitting element of claim 1.

18. The light-emitting array according to claim 17, further comprising a conductive line connecting the light-emitting units in series, parallel, or anti-parallel.

* * * * *